(12) United States Patent
Chuang et al.

(10) Patent No.: US 9,397,112 B1
(45) Date of Patent: Jul. 19, 2016

(54) L-SHAPED CAPACITOR IN THIN FILM STORAGE TECHNOLOGY

(71) Applicant: Taiwan Semiconductor Manufacturing Co., Ltd., Hsin-Chu (TW)

(72) Inventors: Harry-Hak-Lay Chuang, Zhubei (TW); Wei Cheng Wu, Zhubei (TW); Chien-Hung Chang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/645,993

(22) Filed: Mar. 12, 2015

Related U.S. Application Data

(60) Provisional application No. 62/112,701, filed on Feb. 6, 2015.

(51) Int. Cl.
| H01L 27/108 | (2006.01) |
| H01L 27/115 | (2006.01) |
| H01L 49/02 | (2006.01) |
| H01L 29/51 | (2006.01) |
| H01L 21/28 | (2006.01) |

(52) U.S. Cl.
CPC .... *H01L 27/11573* (2013.01); *H01L 21/28282* (2013.01); *H01L 27/11568* (2013.01); *H01L 28/60* (2013.01); *H01L 28/90* (2013.01); *H01L 29/51* (2013.01)

(58) Field of Classification Search
CPC ............ H01L 27/105; H01L 27/11568; H01L 27/11573; H01L 28/82; H01L 29/42344; H01L 29/792; H01L 27/10852; H01L 27/10894
USPC ................. 257/296, 315, 314, 324, 306, 325; 438/243, 423, 267, 239, 261; 363/127
See application file for complete search history.

(56) References Cited

U.S. PATENT DOCUMENTS

| 6,277,686 | B1 | 8/2001 | Yeh et al. |
| 6,674,118 | B2 | 1/2004 | Yeh et al. |
| 6,842,370 | B2 * | 1/2005 | Forbes ............... G11C 16/0475 257/390 |
| 6,849,895 | B2 * | 2/2005 | Osabe .................... B82Y 10/00 257/311 |
| 7,524,719 | B2 * | 4/2009 | Steimle ................. H01L 27/115 257/E21.68 |
| 8,969,940 | B1 * | 3/2015 | Yater ................. H01L 29/42328 257/314 |
| 2001/0000336 | A1 * | 4/2001 | Kim ....................... B82Y 10/00 438/423 |
| 2007/0037347 | A1 * | 2/2007 | Kim ....................... B82Y 10/00 438/243 |
| 2008/0029805 | A1 * | 2/2008 | Shimamoto ....... H01L 21/28282 257/315 |
| 2009/0090948 | A1 * | 4/2009 | Sato ..................... H01L 27/105 257/296 |

(Continued)

OTHER PUBLICATIONS

Ee Herald. "Flash Memory Basics and its Interface to a Processor." Jan. 30, 2015. http://www.eeherald.com/section/design-guide/esmod16.html.

*Primary Examiner* — Mohammed Shamsuzzaman
(74) *Attorney, Agent, or Firm* — Eschweiler & Associates, LLC

(57) ABSTRACT

The present disclosure relates to a non-planar FEOL (front-end-of-the-line) capacitor comprising a charge trapping dielectric layer disposed between electrodes, and an associated method of fabrication. In some embodiments, the non-planar FEOL capacitor has a first electrode disposed over a substrate. A charge trapping dielectric layer is disposed onto the substrate at a position adjacent to the first electrode. The charge trapping dielectric layer has an "L" shape, with a lateral component extending in a first direction and a vertical component extending in a second direction. A second electrode is arranged onto the lateral component and is separated from the first electrode by the first component.

18 Claims, 9 Drawing Sheets

(56) References Cited

U.S. PATENT DOCUMENTS

| | | | |
|---|---|---|---|
| 2011/0095348 A1* | 4/2011 | Chakihara | H01L 21/28273 257/298 |
| 2011/0216566 A1* | 9/2011 | Kamata | H01L 29/7869 363/127 |
| 2014/0361361 A1* | 12/2014 | Mihara | G11C 11/5671 257/324 |

\* cited by examiner

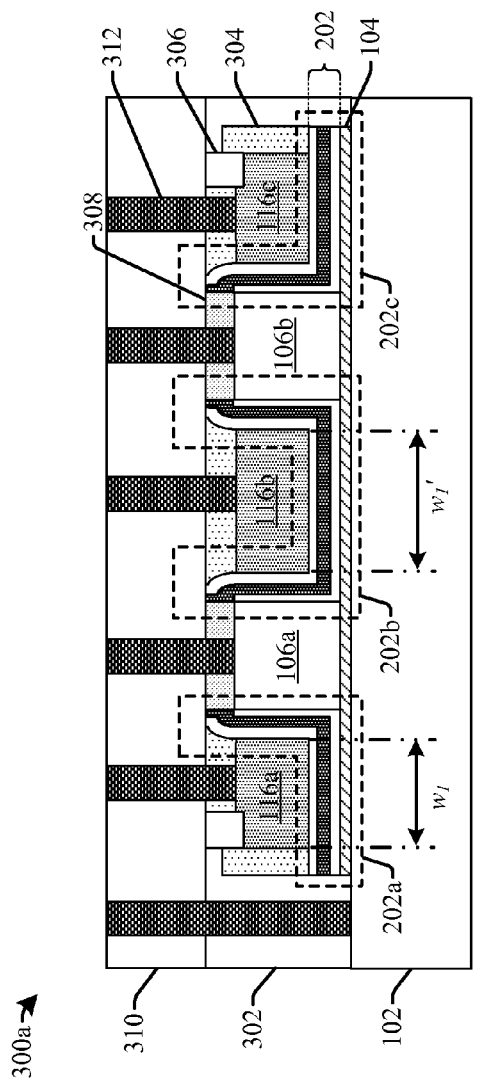
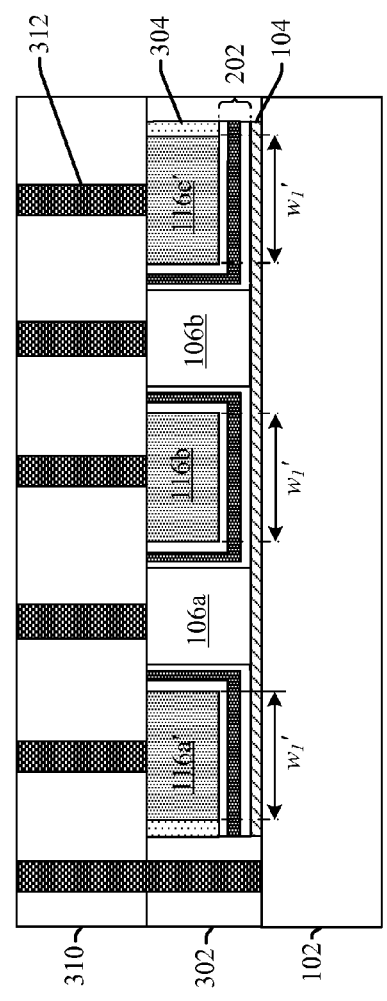
Fig. 3A
Fig. 3B

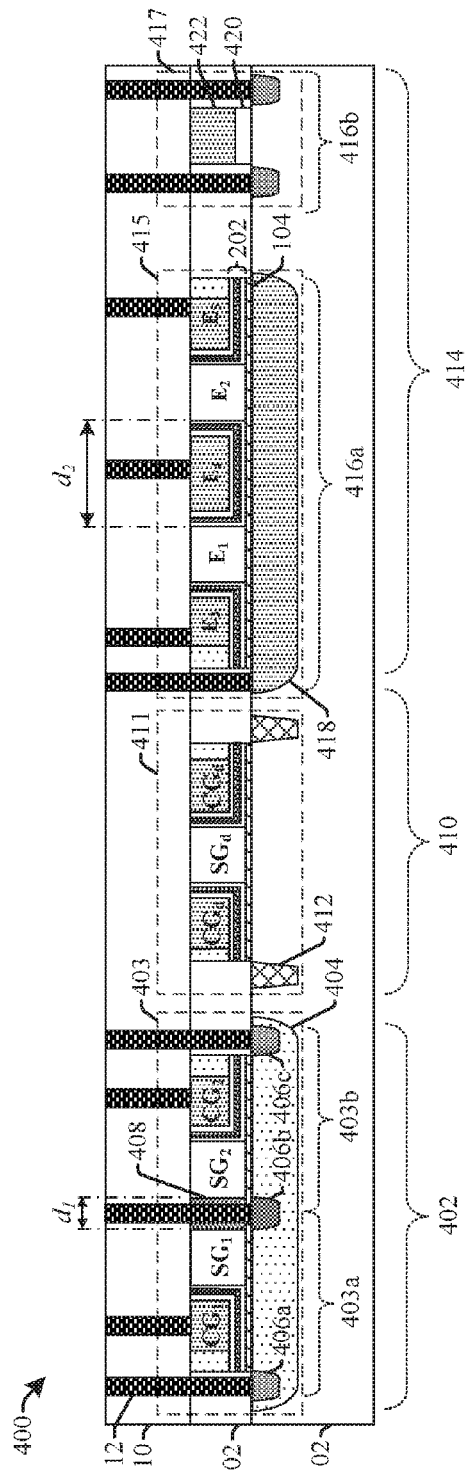
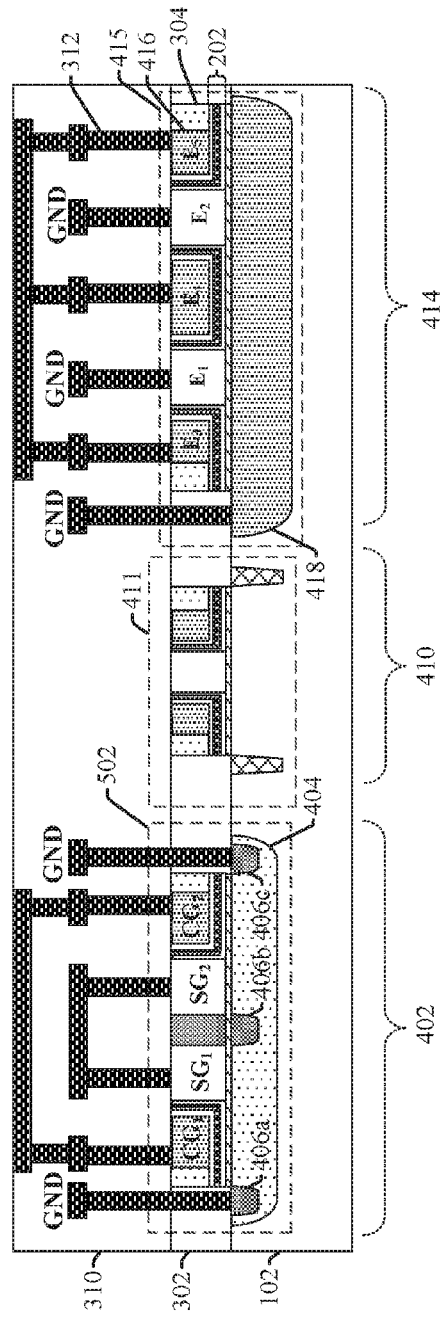
Fig. 4
Fig. 5A

L-SHAPED CAPACITOR IN THIN FILM STORAGE TECHNOLOGY

REFERENCE TO RELATED APPLICATION

This application claims priority to U.S. Provisional Application No. 62/112,701 filed on Feb. 6, 2015.

BACKGROUND

Flash memory is an electronic non-volatile computer storage medium that can be electrically erased and reprogrammed. It is used in a wide variety of electronic devices and equipment (e.g., consumer electronics, automotive, etc.). Common types of flash memory cells include stacked gate memory cells and split-gate memory cells. Split-gate memory cells have several advantages over stacked gate memory cells, such as lower power consumption, higher injection efficiency, less susceptibility to short channel effects, and over erase immunity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3B illustrates cross-sectional views of some additional embodiments of non-planar FEOL capacitors having a charge trapping dielectric layer.

FIG. 4 illustrates a cross-sectional view of some embodiments of a non-planar FEOL capacitor located in a periphery region of an integrated chip having an embedded memory cell.

FIGS. 5A-5B some embodiments of BEOL connections of integrated chips having an embedded flash memory and a non-planar FEOL capacitor.

DETAILED DESCRIPTION

Figure 1:
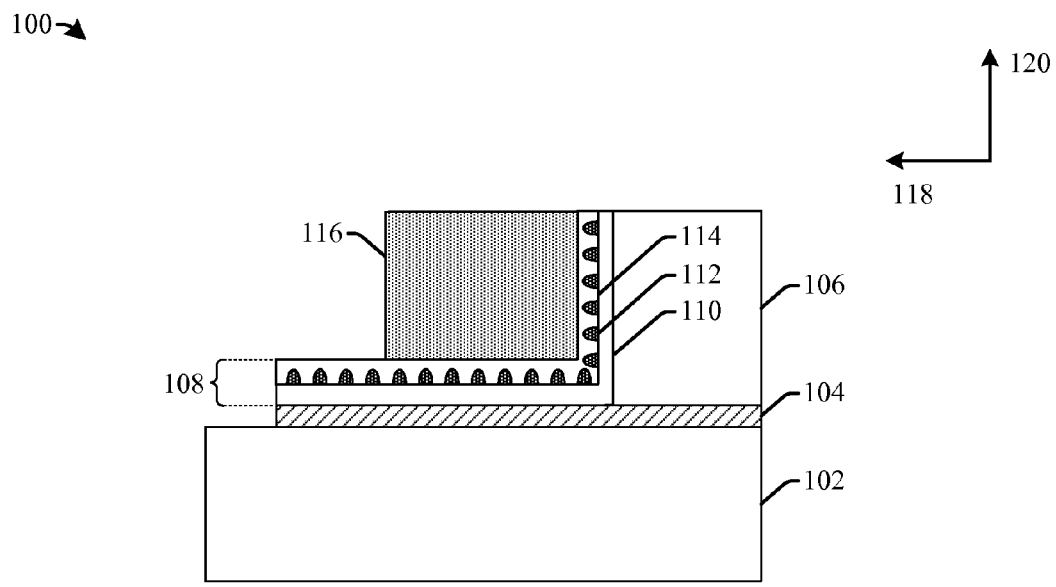
FIG. 1 illustrates a cross-sectional view of some embodiments of a non-planar FEOL (front-end-of-the-line) capacitor having a charge trapping dielectric layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embedded memory has become common in modern day integrated chips. Embedded memory is electronic memory that is located on a same integrated chip die as logic functions (e.g., a processor or ASIC). One common type of embedded memory is embedded flash memory. Embedded flash memory cells include a select gate arranged between first and second source/drain regions of a flash memory cell. The flash memory cell also includes a control gate arranged alongside the select gate. The control gate is separated from the select gate by a charge trapping dielectric layer.

Data can be written to such a flash memory cell by applying voltages to the select gate and to the control gate. Modern day flash memory typically require high voltages (e.g., voltages greater than or equal to approximately 14 V) to implement erase and program operations. To achieve such high voltages, an integrated charge pump may be used. Integrated charge pumps use capacitors to store charge and then to release the charge to achieve a high voltage. Typically, planar PIP (poly-interpoly-poly) capacitors are used in integrated charge pump circuits. However, such PIP capacitors have a smaller height than select and control gates of flash memory cells. It has been appreciated that during fabrication, the smaller height causes masking layers used during fabrication to be thinner in the area of the capacitor. The thinner masking layers fail to provide for sufficient protection of a substrate underlying the PIP capacitors, resulting in damage to the substrate that degrades device performance.

Accordingly, the present disclosure relates to a non-planar FEOL capacitor comprising a charge trapping dielectric layer disposed between electrodes, and an associated method of fabrication. The non-planar FEOL capacitor is formed according to a process that causes the electrodes to have heights that are substantially equal to that of select and control gates of a split-gate memory cell, thereby mitigating damage to an underlying substrate. In some embodiments, the non-planar FEOL capacitor comprises a first electrode disposed over a substrate. A charge trapping dielectric layer is disposed onto the substrate at a position adjacent to the first electrode. The charge trapping dielectric layer comprises an "L" shape, with a lateral component extending in a first direction and a vertical component extending in a second direction. A second electrode is arranged onto the lateral component and is separated from the first electrode by the first component. The non-planar FEOL capacitor provides for a capacitance that is relatively large in comparison to its footprint (due to its lateral and vertical components). Furthermore, the non-planar FEOL capacitor has a relatively low cost since it eliminates the need for patterning of a capacitor top plate.

FIG. 1 illustrates a cross-sectional view of some embodiments of a non-planar front-end-of-the-line (FEOL) capacitor 100 having a charge trapping dielectric layer. It will be appreciated that the term FEOL line refers to pre-metal interconnect layers of an integrated chip, such that the FEOL capacitor is formed prior to the formation of a back-end-of-the-line (BEOL) metal interconnect (e.g., device contacts, metal interconnect wires, and via interconnects).

The non-planar FEOL capacitor 100 comprises a gate dielectric layer 104 disposed onto a semiconductor substrate 102. A first electrode 106, comprising a conductive material, is disposed over the semiconductor substrate 102 at a position overlying the gate dielectric layer 104. In some embodiments, the first electrode 106 may comprise doped polysilicon or a metal (e.g., aluminum), for example. In some embodiments, the first electrode 106 may abut a top surface of the gate dielectric layer 104.

A charge trapping dielectric layer 108 is disposed over the semiconductor substrate 102 at a position overlying the gate dielectric layer 104 and abutting a sidewall of the first electrode 106. The charge trapping dielectric layer 108 comprises an "L" shape. The "L" shape has a lateral component extending in a first direction 118 and a vertical component extending in a second direction 120. In some embodiments, the first direction 118 may be substantially perpendicular to the second direction 120. The vertical component may abut the sidewall of the first electrode 106, while the lateral component may abut the top surface of the gate dielectric layer 104. In some such embodiments, the first electrode 106 and the charge trapping dielectric layer 108 may have bottom surfaces that are substantially aligned along a planar surface.

The charge trapping dielectric layer 108 may comprise a tri-layer structure. In some embodiments, the tri-layer structure may comprise an oxide-nitride-oxide (ONO) structure, having a dielectric layer, a nitride layer disposed over the first oxide layer, and a second oxide layer disposed over the nitride layer. In other embodiments, the tri-layer structure may comprises oxide-nano-crystal-oxide (ONCO) structure having first dielectric layer 110, a plurality of quantum dots 112 disposed over the first dielectric layer 110, and a second dielectric layer 114 disposed over the first dielectric layer 110 and the plurality of quantum dots 112. In some embodiments, the first dielectric layer 110 and the second dielectric layer 114 may comprise oxides. In some embodiments, the plurality of quantum dots 112 may comprise silicon quantum dots. In other embodiments, the plurality of quantum dots 112 may comprise other materials such as gallium, gallium arsenide, graphene, etc.

A second electrode 116 is arranged over the lateral component of the charge trapping dielectric layer 108. The second electrode 116 is laterally separated from the first electrode 106 by the vertical component of the charge trapping dielectric layer 108. In some embodiments, the second electrode 116 may abut the lateral component and the vertical component of the charge trapping dielectric layer 108. In some embodiments, the second electrode 116 may comprise doped polysilicon or metal, for example.

During operation, different voltages are applied to the first electrode 106 and the second electrode 116. The different voltages will generate a potential difference between the first electrode 106 and the second electrode 116. The potential difference generates an electric field that extends across the charge trapping dielectric layer 108. The electric field will cause charges having a first sign (e.g., positive charges) to collect on the first electrode 106 and charges having an opposite, second sign (e.g., negative charges) to collect on the second electrode 116. The potential of the charges stores energy in the non-planar FEOL capacitor 100.

Figure 2:
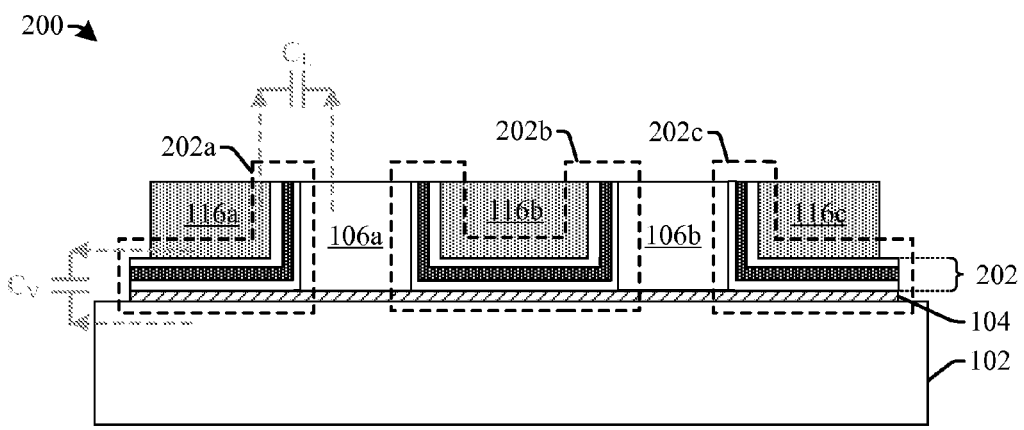
FIG. 2 illustrates a cross-sectional view of some additional embodiments of a non-planar FEOL capacitor having a charge trapping dielectric layer.

FIG. 2 illustrates a cross-sectional view of some additional embodiments of a non-planar FEOL capacitor 200 having a charge trapping dielectric layer.

The non-planar FEOL capacitor 200 comprises a plurality of electrodes disposed over a gate dielectric layer 104. The plurality of electrodes comprise a first electrode 106a and a second electrode 106b arranged onto a top surface of a gate dielectric layer 104. The plurality of electrodes further comprise a third electrode 116a, a fourth electrode 116b, and a fifth electrode 116c that are vertically separated from the gate dielectric layer 104 by a charge trapping dielectric layer 202 (e.g., an ONO layer or a ONCO layer). The first electrode 106a is arranged laterally between a third electrode 116a and a fourth electrode 116b, and the second electrode 106b is arranged laterally between the fourth electrode 116b and a fifth electrode 116c. In various embodiments, the plurality of electrodes may comprise doped polysilicon or metal.

The charge trapping dielectric layer 202 comprises a first component 202a, a second component 202b, and a third component 202c that are laterally separated by the first and second electrodes, 106a and 106b. In some embodiments, the non-planar FEOL capacitor 200 may comprise a symmetric structure. For example, the first component 202a and the third component 202c may be symmetric with respect to an axis of symmetry extending through the second component 202b.

The first component 202a of the charge trapping dielectric layer 202 has an 'L' shape comprising a first lateral component that extends vertically below the third electrode 116a and a first vertical component that extends between the first electrode 106a and the third electrode 116a. In some embodiments, the first lateral component abuts the gate dielectric layer 104 and the first vertical component abuts sidewalls of the first electrode 106a and the third electrode 116a. The second component 202b of the charge trapping dielectric layer 202 is disposed onto an opposite side of the first electrode 106a as the first component 202a. The second component 202b has an 'U' shape comprising a second lateral component that extends vertically below the fourth electrode 116b, a second vertical component that extends between the first electrode 106a and the fourth electrode 116b, and a third vertical component that extends between the second electrode 106b and the fourth electrode 116b. The third component 202c of the charge trapping dielectric layer 202 is disposed onto an opposite side of the second electrode 106b as the second component 202b. The third component 202c has an 'L' shape comprising a third lateral component that extends vertically below the fifth electrode 116c and a fourth vertical component that extends between the second electrode 106b and the fifth electrode 116c.

Each of the components 202a-202c of the charge trapping dielectric layer 202 have a lateral capacitance and a vertical capacitance. For example, the first component 202a of the charge trapping dielectric layer 202 has a vertical capacitance $C_v$ between electrode 116a and the semiconductor substrate 102. The first component 202a of the charge trapping dielectric layer 202 also has a lateral capacitance $C_L$ between electrode 116a and the electrode 106a. Therefore, the capacitance of the non-planar FEOL capacitor 200 is equal to a sum of lateral components (between electrodes 106a and 116a, between electrodes 106a and 116b, between electrodes 116b and 106b, and between electrodes 106b and 116c) and vertical components (between electrode 116a and semiconductor substrate 102, between electrode 116b and semiconductor substrate 102 and between electrode 116c and semiconductor substrate 102) of each of the components 202a-202c of the charge trapping dielectric layer 202.

FIG. 3A illustrates a cross-sectional view of some additional embodiments of a non-planar FEOL capacitor 300a having a charge trapping dielectric layer.

The non-planar FEOL capacitor 300a comprises a dielectric material 302 arranged over a semiconductor substrate 102. In some embodiments, a control gate hard mask layer 304 is located at positions laterally abutting the third electrode 116a and the fifth electrode 116c. In some such embodiments, the control gate hard mask layer 304 may have sidewalls that are substantially aligned with sidewalls of the charge trapping dielectric layer 108. In some embodiments, the control gate hard mask layer 304 may also overlie the third electrode 116a, the fourth electrode 116b and the fifth electrode 116c. In such embodiments, the control gate hard mask layer 304 may abut sidewalls of the first component 202a, the second component 202b and the third component 202c of the charge trapping dielectric layer 202. The control gate hard mask layer 304 may comprise silicon nitride (SiN), for example.

In some embodiments, a select gate hard mask layer 308 may be arranged over the first electrode 106a and the second electrode 106b. In some embodiments, the select gate hard mask layer 308 may have sidewalls that are substantially aligned with sidewalls of the first electrode 106a and the second electrode 106b. A spacer layer 306 may also be arranged over the outer edges of the third electrode 116a and the fifth electrode 116c. The spacer layer 306 may comprise silicon nitride (SiN), for example. In some embodiments, the spacer layer 306 may have sidewalls that are substantially aligned with sidewalls of the third electrode 116a and the fifth electrode 116c.

An inter-layer dielectric (ILD) layer 310 is located over the dielectric material 302. In some embodiments, the ILD layer 310 may comprise a low-k dielectric layer, an ultra low-k dielectric layer, an extreme low-k dielectric layer, and/or a silicon dioxide layer. A plurality of contacts 312 comprising a conductive material extend vertically through the ILD layer 310 to abut the plurality of electrodes. In some embodiments, the plurality of contacts 312 may connect electrodes 116a-116c to a first voltage potential and electrodes 106a-106b and the substrate 102 to a ground terminal. In some embodiments, the plurality of contacts 312 may comprise tungsten, copper, and/or aluminum. Although the plurality of contacts 312 are illustrated as contacting the third electrode 116a, the fourth electrode 116b, and the fifth electrode 116c, it will be appreciated that additional contacts (not shown) may also extend through the ILD layer to abut the first electrode 106a and the second electrode 106b.

In some embodiments, shown in FIG. 3A, a non-planar FEOL capacitor 300a may comprise a "cell like" layout with electrodes 116a-116c having different widths. Such a layout is "cell like" since it is similar to the widths of electrodes in a split-gate flash memory cell, which has a smaller drain electrode with to improve hot electron injection. In such embodiments, electrodes on opposing sides of electrodes 106a and 106b will have different widths. For example, electrode 116a has a first width $w_1$ while electrode 116b has a larger second width $w_1'$ larger than the first width $w_1$.

In some alternative embodiments, shown in FIG. 3B, a non-planar FEOL capacitor 300b may comprise a "source like" layout with electrodes 116a', 116b, and 116c' having substantially equal widths. In such embodiments, electrodes on opposing sides of electrodes 106a and 106b will substantially equal widths. For example, electrode 116a', electrode 116b and electrode 116c' have a second width $w_1'$.

FIG. 4 illustrates a cross-sectional view of some embodiments of a non-planar FEOL capacitor located in a periphery region of an integrated chip 400 having an embedded memory cell.

The integrated chip 400 comprises an embedded memory region 402 and a periphery region 414. The embedded memory region 402 is separated from the periphery region 414 by a boundary region 410. The boundary region 410 configured to provide electrical isolation between the embedded memory region 402 and the periphery region 414.

The embedded memory region 402 comprises a plurality of memory cells. In some embodiments, the embedded memory region 402 comprises a pair of split-gate flash cells 403 comprising a first memory cell 403a and a second memory cell 403b. In some embodiments, the pair of split-gate flash cells 403 are disposed over a first well region 404 having a first doping type (e.g., a p-type doping). In some embodiments, the first memory cell 403a and the second memory cell 403b are mirror images of one another about an axis of symmetry.

The pair of split-gate flash cells 403 includes two individual source/drain regions 406a, 406c, and a common source/drain region 406b that is shared between the memory cells 403a, 403b. The first and second memory cells, 403a, and 403b, respectively include select gates, $SG_1$ and $SG_2$, and control gates, $CG_1$ and $CG_2$, arranged over the cells' respective channel regions. The select gates, $SG_1$ and $SG_2$, comprise a conductive select gate material (e.g., doped polysilicon) and the control gate $CG_1$ and $CG_2$ comprise a conductive control gate material (e.g., doped polysilicon). A charge trapping dielectric layer 202 is disposed between the control gates, $CG_1$ and $CG_2$, and the select gates, $SG_1$ and $SG_2$, in the respective memory cells, 403a and 403b. The select gates, $SG_1$ and $SG_2$, are separated by a distance $d_1$. In some embodiments, a dielectric material 408 is disposed between the select gates, $SG_1$ and $SG_2$. In such embodiments, a contact 312 comprising a conductive material (e.g., tungsten, titanium nitride, etc.) vertically extends through the dielectric material 408 to the underlying shared drain region 406b.

The boundary region 410 comprises one or more isolation structures 412. In some embodiments, the one or more isolation structures 412 may comprise shallow trench isolation (STI) structures extending into the semiconductor substrate 102. In some embodiments, the boundary region 410 further comprises an electrically inactive dummy structure 411. In some embodiments, the dummy structure 411 comprises a dummy select gate $SG_d$ disposed over the gate dielectric layer 104. The dummy select gate $SG_d$ abuts a charge trapping dielectric layer 202 on opposing sides. The charge trapping dielectric layer 202 separates the dummy select gate $SG_d$ from dummy control gates $CG_d$. The dummy control gates $CG_d$ and the dummy select gates $SG_d$ are electrically inactive (i.e., are not connected to BEOL metal interconnect layers).

The periphery region 414 comprises a capacitor section 416a having a non-planar FEOL capacitor 415 and a logic section 416b comprising a plurality of logic elements. The non-planar FEOL capacitor 415 comprises a plurality of electrodes $E_1$-$E_5$. Electrodes $E_1$ and $E_2$ comprise a same select gate material as select gates $SG_1$ and $SG_2$. Electrodes $E_3$-$E_5$ comprise a same control gate material as control gates $CG_1$ and $CG_2$. In some embodiments, electrodes $E_1$-$E_2$ are separated by a distance $d_2$ that is greater than distance $d_1$. The plurality of electrodes $E_1$-$E_5$ have top surfaces that are substantially aligned with the top surface of the control gates, $CG_1$ and $CG_2$, and the select gates, $SG_1$ and $SG_2$, of the split-gate flash memory cell 403. In some embodiments, the non-planar FEOL capacitor 415 is disposed over a second well region 418 having a second doping type (e.g., an n-type doping) that is different than the first doping type of the first well region 404.

The plurality of logic elements may comprise a high-k metal gate transistor 417. The high-k metal gate transistor 417 comprises a high-k dielectric layer 420 and an overlying replacement metal gate electrode 422. In some embodiments, the high-k dielectric layer 420 may comprise a bottom high temperature oxide layer and an overlying high-k dielectric layer comprising hafnium oxide (HfO), hafnium silicon oxide (HfSiO), hafnium aluminum oxide (HfAIO), or hafnium tantalum oxide (HfTaO), for example. In some embodiments, an etch-stop layer (not shown) is arranged between the high-k dielectric layer 420 and an overlying replacement metal gate electrode 422.

Figure 5B:
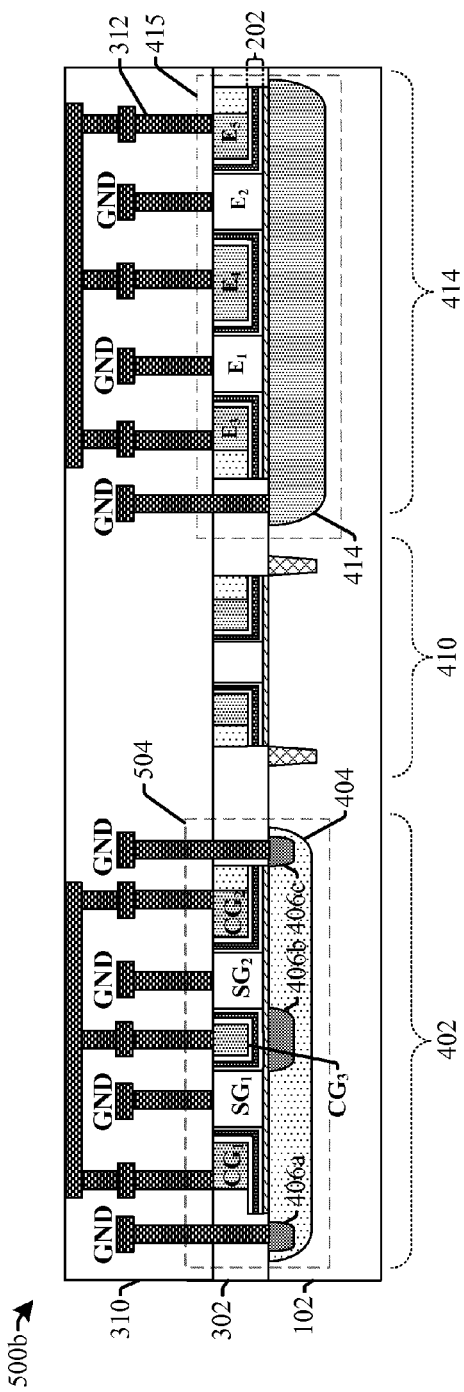

FIGS. 5A-5B illustrate some embodiments of metal interconnect schemes for an integrated chip 500 having an embedded flash memory and a non-planar FEOL capacitor.

As shown in FIG. 5A, in some embodiments, electrodes $E_1$ and $E_2$ of the non-planar FEOL capacitor 415 are electrically connected to a ground terminal. Electrodes $E_3$-$E_5$ of the non-planar FEOL capacitor 415 are electrically connected to a shared metal interconnect wire at a variable voltage value. The semiconductor substrate 102 is also connected to a ground terminal. By connecting electrodes $E_1$ and $E_2$ and the semiconductor substrate 102 to the ground terminal and electrodes $E_3$-$E_5$ to the variable voltage value, a capacitance is formed between electrodes $E_1$ and $E_2$ and electrodes $E_3$-$E_5$ and between electrodes $E_1$ and $E_2$ and the semiconductor substrate 102.

It will be appreciated that the connections of the non-planar FEOL capacitor 415 will remain the same irrespective of a type of split-gate memory cell within the embedded memory region 402. For example, FIG. 5A illustrates a split-gate memory cell 502 without a drain control gate. In such a split-gate memory cell 502 the select gates $SG_1$ and $SG_2$ are connected together. FIG. 5B illustrates a split-gate memory cell 504 having a drain control gate $CG_3$ located between select gates $SG_1$ and $SG_2$. In such a split-gate memory cell 504 the select gates $SG_1$ and $SG_2$ are connected to a ground terminal.

Figure 6:
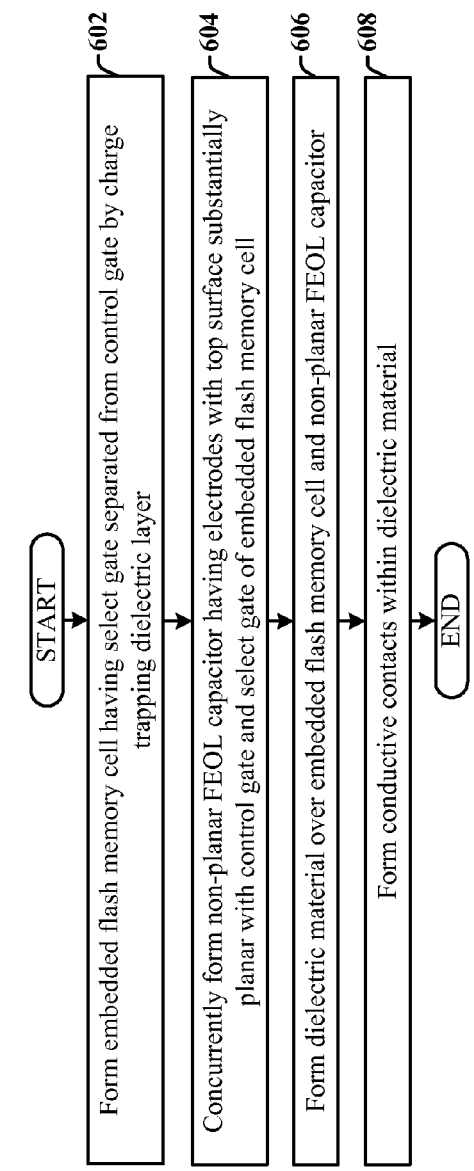
FIG. 6 illustrates a flow diagram of some embodiments of a method of forming a non-planar FEOL capacitor having a charge trapping dielectric layer.

FIG. 6 illustrates a flow diagram of some embodiments of a method 600 of forming an integrated chip having a non-planar FEOL capacitor with a charge trapping dielectric layer.

While the disclosed methods (e.g., methods 600 and 700) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 602, an embedded flash memory cell is formed. The embedded flash memory cell has a select gate separated from control gate by charge trapping dielectric layer.

At 604, a non-planar FEOL capacitor is concurrently formed along with the embedded flash memory cell. The non-planar FEOL capacitor comprises a plurality of electrodes with top surface substantially planar with control gate and select gate of embedded flash memory cell. It will be appreciated that the term concurrently does not mean that all fabrication steps used to form the non-planar FEOL capacitor and the embedded flash memory cell are performed at the same time, but rather that at least one step fabrication steps used to form the non-planar FEOL capacitor and the embedded flash memory cell are performed at the same time At 606, a dielectric material is formed over the embedded flash memory cell and the non-planar FEOL capacitor.

At 608, contacts are formed within the dielectric material.

Figure 7:
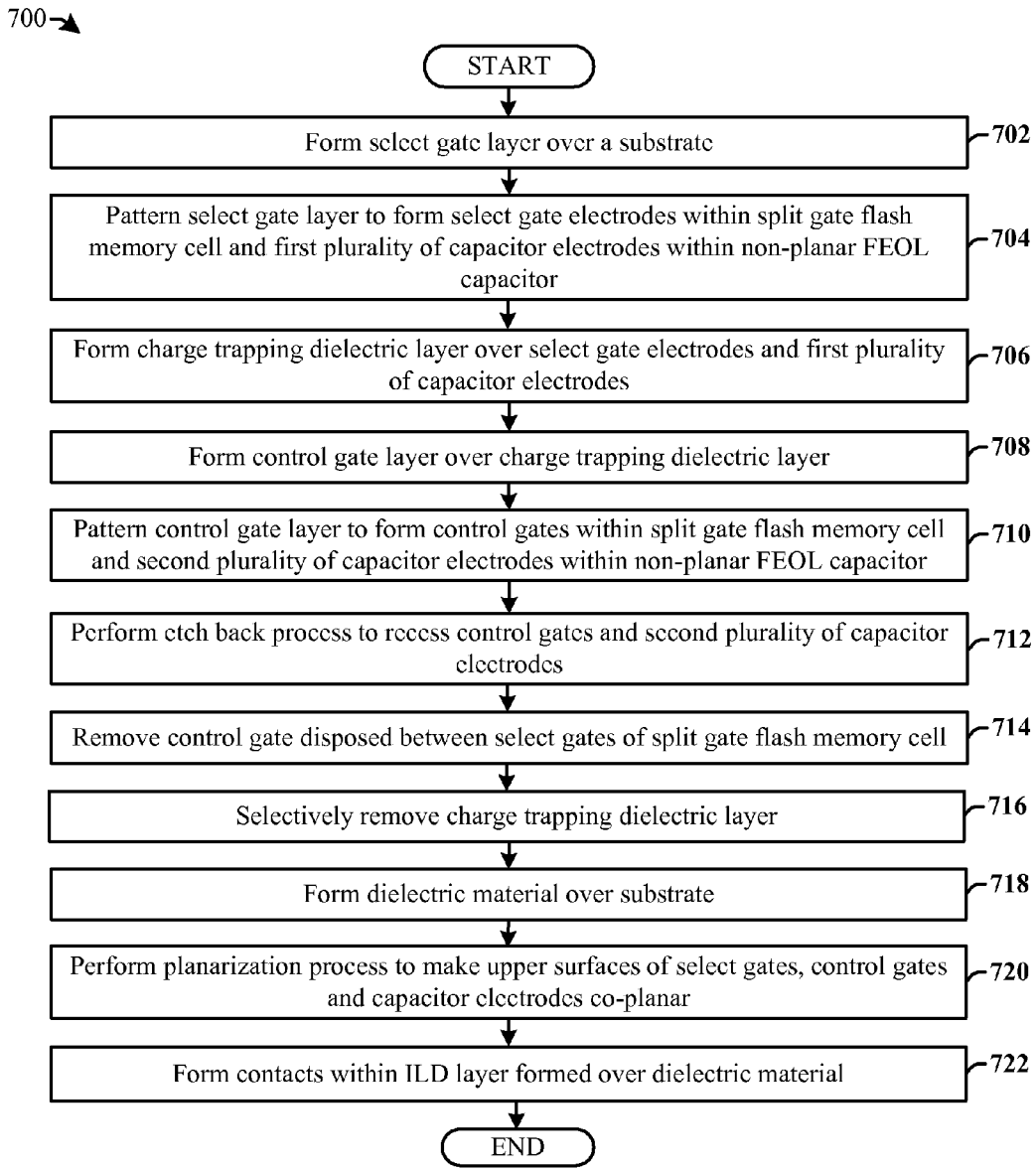
FIG. 7 illustrates a flow diagram of some additional embodiments of a method of forming a non-planar FEOL capacitor having a charge trapping dielectric layer.

FIG. 7 illustrates a flow diagram of some additional embodiments of a method 700 of forming an integrated chip having a non-planar FEOL capacitor with a charge trapping dielectric layer.

At 702, a select gate layer is formed over a substrate.

At 704, the select gate material is patterned to form select gates within a split-gate flash memory cell and a first plurality of capacitor electrodes within a non-planar FEOL capacitor.

At 706, a charge trapping dielectric layer is formed over the select gates and the first plurality of capacitor electrodes.

At 708, a control gate layer is formed over the charge trapping dielectric layer.

At 710, the control gate layer is patterned to form control gates within the split-gate flash memory cell and a second plurality of capacitor electrodes within the non-planar FEOL capacitor.

At 712, perform etch back process to recess control gates and second plurality of capacitor electrodes.

At 714, a control gate disposed between select gates of the split-gate flash memory cell (i.e., a drain side control gate) may be removed.

At 716, the charge trapping dielectric layer is selectively removed.

At 718, a dielectric material is formed over the substrate.

At 720, a planarization process is performed to make upper surfaces of select gates, control gates, and capacitor electrodes co-planar.

At 722, contacts are formed within an inter-level dielectric layer formed over the dielectric material.

FIGS. 8-17 illustrate some embodiments of cross-sectional views showing a method of forming an integrated chip having a non-planar FEOL capacitor with a charge trapping dielectric layer. Although FIGS. 8-17 are described in relation to method 700, it will be appreciated that the structures disclosed in FIGS. 8-17 are not limited to such a method, but instead may stand alone as structures independent of the method.

Figure 8:
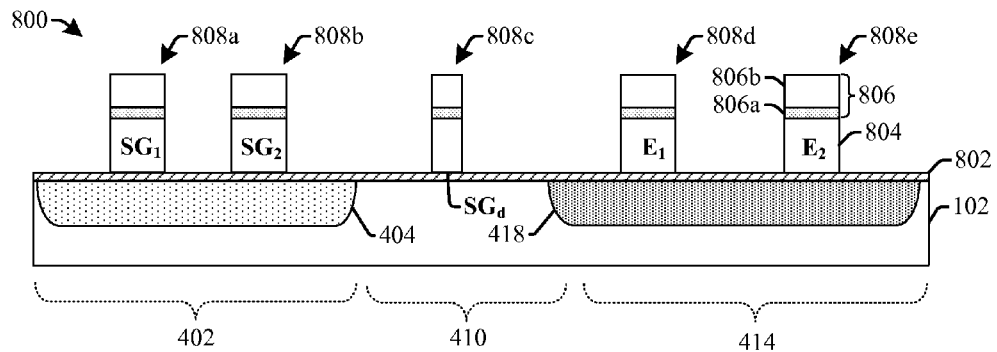
FIGS. 8-17 illustrate some embodiments of cross-sectional views showing a method of forming an integrated chip having a non-planar FEOL capacitor having a charge trapping dielectric layer.

FIG. 8 illustrates some embodiments of a cross-sectional view 800 of an integrated chip corresponding to acts 702-704.

As shown in cross-sectional view 800, the integrated chip comprises a semiconductor substrate 102 having an embedded memory region 402 and a periphery region 414, which are separated by a boundary region 410. The embedded memory region 402 comprises a first well region 404 having a first doping type (e.g., a p-type doping). The periphery region 414 comprises a second well region 418 having a second doping type different than the first doping type (e.g., an n-type doping).

A gate dielectric layer 802 (e.g., $SiO_2$) is formed over a semiconductor substrate 102. In some embodiments, the gate dielectric layer 802 comprises an oxide (e.g., $SiO_2$) formed by way of a thermal process or by a deposition process (e.g., chemical vapor deposition (CVD), physical vapor deposition (PVD), atomic layer deposition (ALD), etc.). A select gate layer 804 is formed over the gate dielectric layer 802. In some embodiments, the select gate layer 804 may comprise doped polysilicon or metal formed by a deposition process (e.g., CVD, PVD, ALD, etc.)

After being deposited, the select gate layer 804 is patterned according to a select gate hard mask layer 806 configured to define select gate material stacks 808. In some embodiments, the select gate hard mask layer 806 may comprise a first hard mask layer 806a and a second overlying hard mask layer 806b. The select gate hard mask layer 806 may be patterned according to a photolithography process. The select gate layer 804 is then selectively exposed to an etchant in areas not masked by the select gate hard mask layer 806 to form select gates $SG_1$ and $SG_2$ within the embedded memory region 402, a dummy select gate $SG_d$ within the boundary region 410, and a first plurality of capacitor electrodes $E_1$-$E_2$ within the periphery region 414. In some embodiments, the select gate hard mask layer 806 may comprise one or more of an oxide (e.g., $SiO_2$) or a nitride (e.g., SiN).

Figure 9:
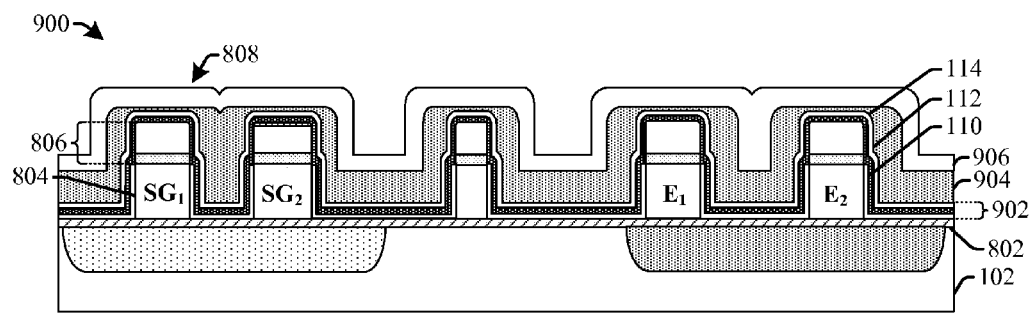

FIG. 9 illustrates some embodiments of a cross-sectional view 900 of an integrated chip corresponding to acts 706-708.

As shown in cross-sectional view 900, a charge trapping dielectric layer 902 is formed over the semiconductor substrate 102 and the select gate material stacks 808. The charge trapping dielectric layer 902 abuts the gate dielectric layer 802 between the select gate material stacks 808, the sidewalls of the patterned select gate layer 804, and top surfaces of the select gate hard mask layer 806. In some embodiments, the charge trapping dielectric layer 902 may comprise a tri-layer structure. In some embodiments, the tri-layer structure may have a first dielectric layer 110, a plurality of quantum dots 112 disposed over the first dielectric layer 110, and a second dielectric layer 114 disposed over the first dielectric layer 110 and the plurality of quantum dots 112.

A control gate layer 904 is conformally formed onto the charge trapping dielectric layer 902. In some embodiments, the control gate layer 904 may comprise doped polysilicon. In some embodiments, the control gate layer 904 may comprise doped polysilicon or metal formed by a deposition process (e.g., CVD, PVD, ALD, etc.). A spacer layer 906 is conformally formed onto the control gate layer 904. In some embodiments, spacer layer 906 may comprise an oxide (e.g., $SiO_2$) or a nitride (e.g., SiN) formed by a deposition process.

Figure 10:
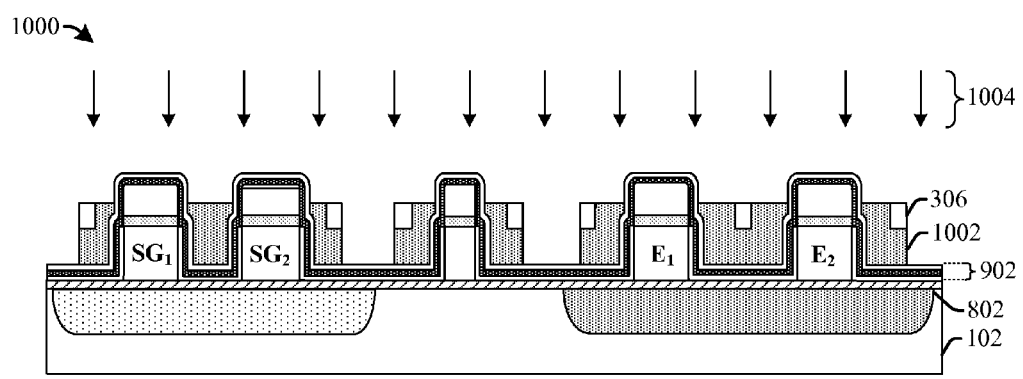

FIG. 10 illustrates some embodiments of a cross-sectional view 1000 of an integrated chip corresponding to act 710.

As shown in cross-sectional view 1000, the control gate layer 904 is patterned. In some embodiments, the control gate layer 1002 is patterned by performing a first etching process, which exposes the substrate to a first etchant 1004 configured to remove portions of the control gate layer 1002 and the spacer layer 306. The first etching process leaves a vertical portion of the control gate layer 1002 and the spacer layer 306 disposed along sidewalls of the charge trapping dielectric layer 902. In some embodiments, the first etchant 1004 comprises a dry etch (e.g., a plasma etch with tetrafluoromethane ($CF_4$), sulfur hexafluoride ($SF_6$), nitrogen trifluoride ($NF_3$), etc.).

Figure 11:
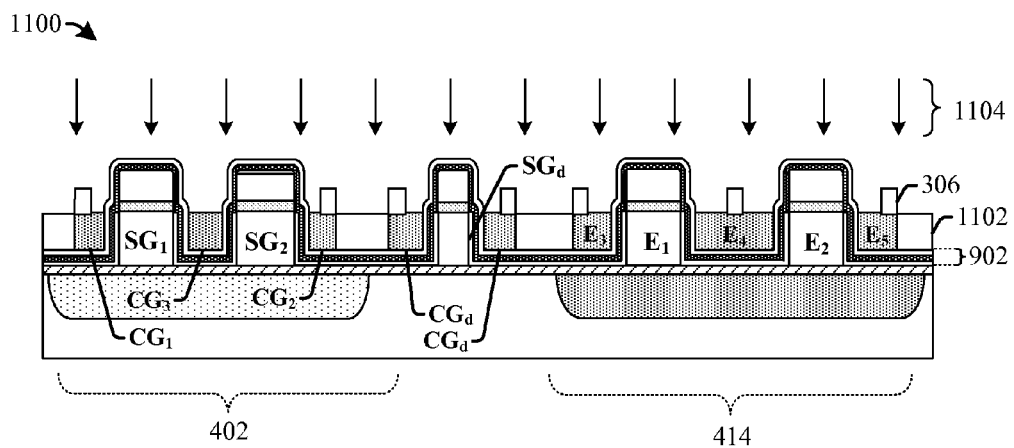

FIG. 11 illustrates some embodiments of a cross-sectional view 1100 of an integrated chip corresponding to act 712.

As shown in cross-sectional view 1100, an etch back process is performed to recess the control gate layer 1002 to form control gates $CG_1$-$CG_3$ within the embedded memory region 402 and a second plurality of capacitor electrodes $E_3$-$E_5$ within the periphery region 414. The etch back process selectively exposes the control gate layer 1002 to a second etchant 1104. The second etchant 1104 has a large etching selectivity, which etches the control gate layer 1002 (e.g., polysilicon) without substantially etching the spacer layer 306 (e.g., oxide and/or nitride material). This etch back process reduces the height of the control gate layer 1002 so that the control gates $CG_1$-$CG_3$ and the second plurality of capacitor electrodes $E_3$-$E_5$ have upper surfaces are substantially aligned with upper surfaces of the select gates $SG_1$, $SG_2$ and the first plurality of capacitor electrodes $E_1$-$E_2$. In some embodiments, a masking layer 1102 may be disposed over the substrate the charge trapping dielectric layer 902. In some embodiments, the masking layer 1102 may comprise a bottom antireflective coating (BARC) formed on the substrate through a spin-coating or other appropriate technique. The BARC has a substantially uniform thickness between the embedded memory region 402 and the periphery region 414

Figure 12:
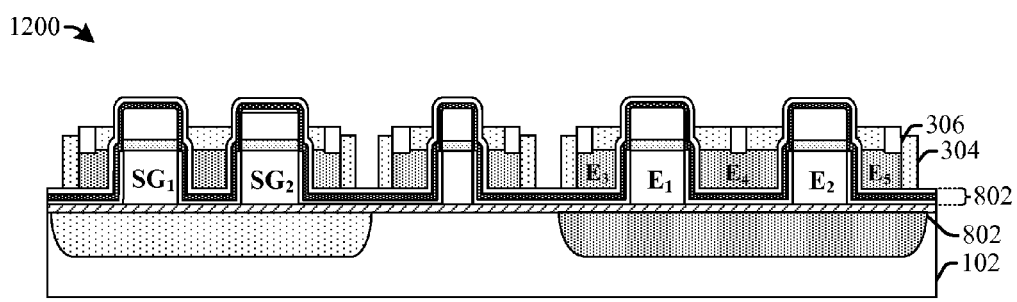

FIG. 12 illustrates some embodiments of a cross-sectional view 1200 of an integrated chip corresponding to act 714.

As shown in cross-sectional view 1200, a control gate hard mask layer 304 is formed onto the control gates $CG_1$-$CG_3$ and the second plurality of capacitor electrodes $E_3$-$E_5$. The control gate hard mask layer 304 may be formed by a deposition process and a subsequent etching process. In some embodiments, the control gate hard mask layer 304 may comprise an oxide or a nitride, for example.

Figure 13:
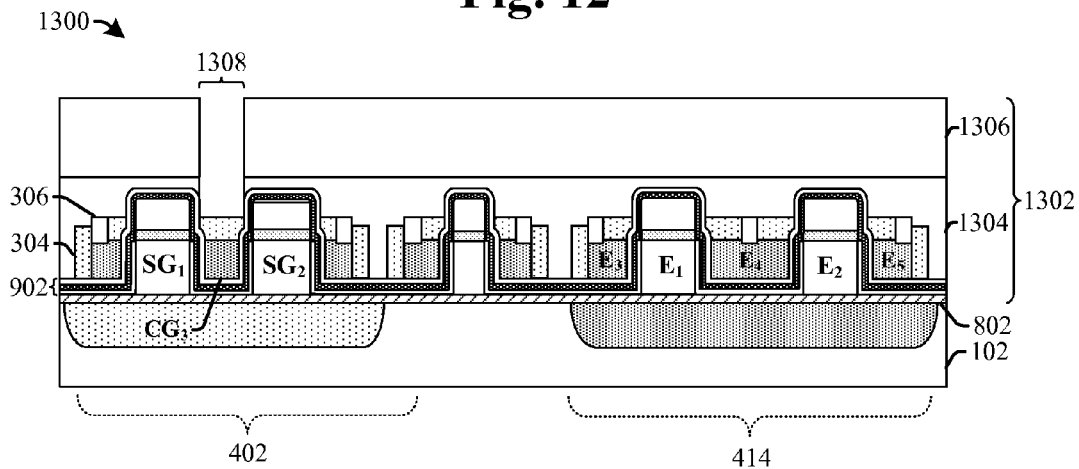
Figure 14:
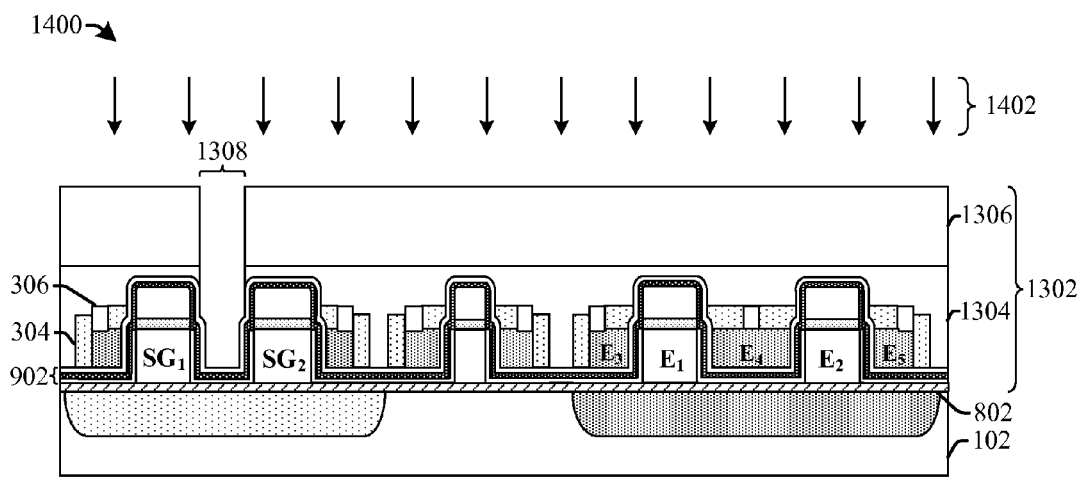

FIGS. 13-14 illustrate some embodiments of cross-sectional views, 1300 and 1400, of an integrated chip corresponding to act 714.

As shown in cross-sectional view 1300, a masking structure 1302 is formed over the substrate. In some embodiments, the masking structure 1302 may comprise a BARC 1304 formed on the substrate through a spin-coating or other appropriate technique. The BARC 1304 has a substantially uniform thickness between the embedded memory region 402 and the periphery region 414. The BARC 1304 is configured to protect the substrate during a subsequently-performed etch. The masking structure 1302 may further comprise a photoresist layer 1306 overlying the BARC 1304. The masking structure 1302 comprises an opening 1308 overlying the control gate $CG_3$ of the split-gate flash memory cell (i.e., between select gates $SG_1$ and $SG_2$).

As shown in cross-sectional view 1400, a second etching process is carried out to remove control gate $CG_3$ (i.e., drain side control gate). The second etching process selectively exposes the control gate $CG_3$ to a third etchant 1402 according to the masking structure 1302. The third etchant 1402 is configured to remove the control gate $CG_3$. In some embodiments, the third etchant 1402 comprises a dry etchant.

Figure 15:
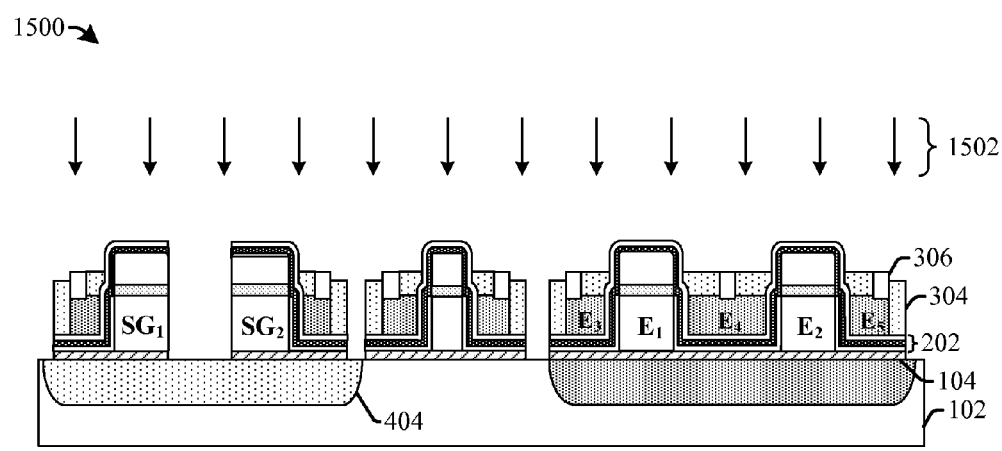

FIG. 15 illustrates some embodiments of a cross-sectional view 1500 of an integrated chip corresponding to act 716.

As shown in cross-sectional view 1500, the charge trapping dielectric layer 202 is selectively removed. The charge trapping dielectric layer 202 may be removed by exposing the substrate to a fourth etchant 1502.

Source/drain extension regions (not shown) may be subsequently formed within the first well region 404 according to openings in the above layers. The source and drain regions may be formed by implanting the substrate with a dopant species, such as boron (B) or phosphorous (P), for example. The dopant species may be subsequently driven into the semiconductor substrate 102 by an anneal process.

Figure 16:
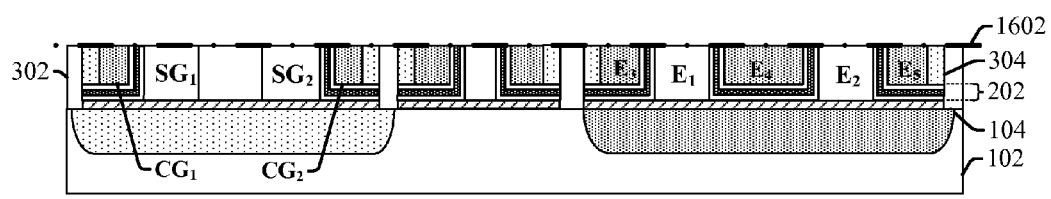

FIG. 16 illustrates some embodiments of a cross-sectional view 1600 of an integrated chip corresponding to acts 718-720.

As shown in cross-sectional view 1600. A dielectric material 302 is formed onto the semiconductor substrate 102 and a planarization process is subsequently performed. The planarization process remove materials overlying line 1602 so as to make upper surfaces of select gates $SG_1$ and $SG_2$, control gates $CG_1$ and $CG_2$, and capacitor electrodes $E_1$-$E_5$ co-planar. In some embodiments the dielectric material 302 may comprise silicon oxide, formed by way of a deposition process (e.g., CVD, PVD, etc.). In some embodiments, the planarization process may comprise a chemical mechanical polishing (CMP) process, for example.

Figure 17:
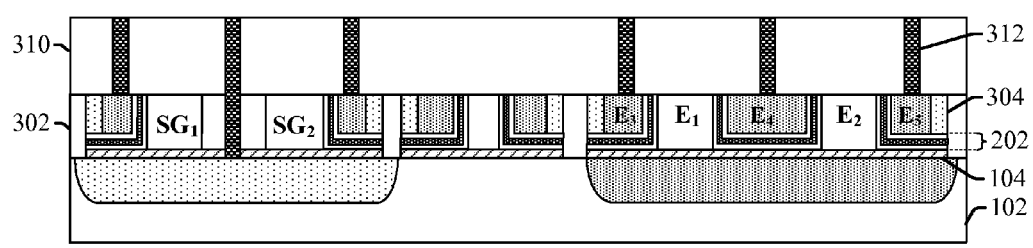

FIG. 17 illustrates some embodiments of a cross-sectional view 1700 of an integrated chip corresponding to act 722.

As shown in cross-sectional view 1700, contacts 312 are formed within an inter-layer dielectric (ILD) layer 310 overlying the dielectric material 302. The contacts 312 may be formed by selectively etching the ILD layer 310 to form openings, and by subsequently depositing a conductive material within the openings. In some embodiments, the conductive material may comprise tungsten (W) or titanium nitride (TiN), for example.

Therefore, the present disclosure relates to a non-planar FEOL (front-end-of-the-line) capacitor comprising a charge trapping dielectric layer disposed between electrodes, and an associated method of fabrication.

In some embodiments, the present disclosure relates to an integrated capacitor. The integrated capacitor comprises a first electrode disposed over a substrate. A charge trapping dielectric layer is disposed onto the substrate at a position adjacent to the first electrode. The charge trapping dielectric layer comprises an "L" shape, with a lateral component extending in a first direction and a vertical component extending in a second direction different than the first direction. A second electrode is arranged onto the lateral component and separated from the first electrode by the vertical component In other embodiments, the present disclosure relates to an integrated chip. The integrated chip comprises a gate dielectric layer disposed over a semiconductor substrate, and a first electrode abutting a top surface of the gate dielectric layer. A charge trapping dielectric layer abuts the top surface of the gate dielectric layer at a position adjacent to the first electrode. The charge trapping dielectric layer comprises a lateral component extending in a first direction and a vertical component extending in a second direction different than the first direction. A second electrode is arranged onto the lateral component and separated from the first electrode by the vertical component. A split-gate flash memory cell is disposed over the substrate at a position that is laterally separated from the first electrode by a boundary region.

In yet other embodiments, the present disclosure relates to a method of forming an integrated chip. The method comprises forming a select gate layer over a semiconductor substrate having an embedded memory region laterally separated from a periphery region, and patterning the select gate layer to form select gates within the embedded memory region and a first plurality of capacitor electrodes within the periphery region. The method further comprises forming a charge trapping dielectric layer over the select gates and the first plurality of capacitor electrodes. The method further comprises forming a control gate layer over the charge trapping dielectric layer, and patterning the control gate layer to form control gates within the embedded memory region and a second plurality of capacitor electrodes within the periphery region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated capacitor, comprising: a first capacitor electrode disposed over a substrate; a charge trapping dielectric layer disposed onto the substrate at a position adjacent to the first capacitor electrode, wherein the charge trapping dielectric layer comprises an "L" shape, with a lateral component extending in a first direction and a vertical component extending in a second direction different than the first direction;
a second capacitor electrode arranged onto the lateral component and separated from the first capacitor electrode by the vertical component, wherein an upper surface of the first capacitor electrode is substantially aligned with an upper surface of the second capacitor electrode; and
wherein the first capacitor electrode and the second capacitor electrode are disposed over the substrate at positions that are laterally separated from a split-gate flash memory cell by a boundary region comprising one or more isolation structures arranged within the substrate and a dummy structure comprising a dummy select gate and a dummy control gate arranged laterally separated from the first capacitor electrode by a dielectric material overlying the substrate.

2. The capacitor of claim 1, wherein the charge trapping dielectric layer comprises:
a first dielectric layer disposed over the substrate;
a plurality of quantum dots disposed over the first dielectric layer; and
a second dielectric layer disposed over the first dielectric layer and the plurality of quantum dots.

3. The capacitor of claim 1, wherein the first capacitor electrode is coupled to a ground terminal and wherein the second capacitor electrode is coupled to a variable voltage value.

4. The capacitor of claim 1, wherein the first capacitor electrode and the second capacitor electrode are located in a periphery region of an integrated chip that surrounds an embedded memory region comprising a plurality of memory cells.

5. The capacitor of claim 4,
wherein the first capacitor electrode and the second capacitor electrode are disposed over a first well region having a first doping type; and
wherein the embedded memory region is disposed over a second well region having a second doping type that is different than the first doping type.

6. The capacitor of claim 1, further comprising:
a gate dielectric layer disposed over the substrate, wherein the first capacitor electrode and the charge trapping dielectric layer abut a top surface of the gate dielectric layer.

7. The capacitor of claim 1, further comprising:
a second charge trapping dielectric layer that is discontinuous with and laterally separated from the charge trapping dielectric layer by the first capacitor electrode, wherein the second charge trapping dielectric layer comprises a second lateral component extending in a third direction opposite the first direction and a second vertical component extending in the second direction; and
a third capacitor electrode arranged onto the second lateral component and separated from the first capacitor electrode by the second vertical component.

8. The capacitor of claim 7,
wherein the second capacitor electrode and the third capacitor electrode are electrically coupled to a first voltage value; and
wherein the first capacitor electrode is electrically coupled to a ground terminal.

9. The capacitor of claim 1, wherein the first direction is substantially perpendicular to the second direction.

10. An integrated chip, comprising:
 a gate dielectric layer disposed over a semiconductor substrate;
 a first capacitor electrode abutting a top surface of the gate dielectric layer;
 a charge trapping dielectric layer abutting the top surface of the gate dielectric layer at a position adjacent to the first capacitor electrode, wherein the charge trapping dielectric layer comprises a lateral component extending in a first direction and a vertical component extending in a second direction different than the first direction;
 a second capacitor electrode arranged onto the lateral component and separated from the first capacitor electrode by the vertical component wherein an upper surface of the first capacitor electrode is substantially aligned with an upper surface of the second capacitor electrode;
 a split-gate flash memory cell disposed over the semiconductor substrate;
 a boundary region laterally arranged between the split-gate flash memory cell and the first capacitor electrode, wherein the boundary region comprises a dummy select gate and a dummy control gate laterally separated from the first capacitor electrode by a dielectric material arranged over the semiconductor substrate.

11. The integrated chip of claim 10, wherein the charge trapping dielectric layer comprises:
 a first dielectric layer disposed over the semiconductor substrate;
 a plurality of quantum dots disposed over the first dielectric layer; and
 a second dielectric layer disposed over the first dielectric layer and the plurality of quantum dots.

12. The integrated chip of claim 10, wherein the first direction is substantially perpendicular to the second direction.

13. The integrated chip of claim 10,
 wherein the first capacitor electrode and the second capacitor electrode are disposed over a first well region having a first doping type; and
 wherein the split-gate flash memory cell is disposed over a second well region having a second doping type that is different than the first doping type.

14. The integrated chip of claim 10, further comprising:
 a second charge trapping dielectric layer disposed onto an opposite side of the first capacitor electrode as the charge trapping dielectric layer, wherein the second charge trapping dielectric layer comprises a second lateral component extending in the first direction and a second vertical component extending in the second direction; and
 a third capacitor electrode arranged onto the second lateral component and separated from the first capacitor electrode by the second vertical component.

15. The integrated chip of claim 14, wherein the first capacitor electrode is coupled to a ground terminal and wherein the second capacitor electrode is coupled to a variable voltage value.

16. An integrated chip, comprising: a gate dielectric layer disposed over a semiconductor substrate; a first capacitor electrode abutting a top surface of the gate dielectric layer;
 a charge trapping dielectric layer abutting the top surface of the gate dielectric layer at a position laterally adjacent to the first capacitor electrode;
 a second capacitor electrode arranged vertically over the charge trapping dielectric layer and laterally separated from the first capacitor electrode by the charge trapping dielectric layer wherein an upper surface of the first capacitor electrode is substantially aligned with an upper surface of the second capacitor electrode;
 a hard mask layer that vertically contacts a lateral surface of the charge trapping dielectric layer and is laterally separated from the first capacitor electrode by the charge trapping dielectric layer; and
 wherein the first capacitor electrode and the second capacitor electrode are disposed over the semiconductor substrate at positions that are laterally separated from a split-gate flash memory cell by a boundary region comprising one or more isolation structures arranged within the semiconductor substrate and a dummy structure comprising a dummy select gate and a dummy control gate arranged laterally separated from the first capacitor electrode by a dielectric material overlying the semiconductor substrate.

17. The integrated chip of claim 10, wherein the dummy select gate has a lower surface that is substantially aligned with a lower surface of the first capacitor electrode.

18. The integrated chip of claim 10, wherein the first capacitor electrode, the second capacitor electrode, the dummy select gate, and the dummy control gate have substantially aligned upper surfaces.

\* \* \* \* \*